United States Patent
Jung et al.

(10) Patent No.: US 7,662,707 B2
(45) Date of Patent: Feb. 16, 2010

(54) METHOD OF FORMING RELATIVELY CONTINUOUS SILICIDE LAYERS FOR SEMICONDUCTOR DEVICES

(75) Inventors: Sug-Woo Jung, Gyeonggi-do (KR);
Gil-Heyun Choi, Gyeonggi-do (KR);
Jong-Ho Yun, Gyeonggi-do (KR);
Hyun-Su Kim, Gyeonggi-do (KR);
Eun-Ji Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 493 days.

(21) Appl. No.: 11/247,770

(22) Filed: Oct. 11, 2005

(65) Prior Publication Data

US 2006/0079074 A1    Apr. 13, 2006

(30) Foreign Application Priority Data

Oct. 11, 2004  (KR) .................. 10-2004-0080805

(51) Int. Cl.
*H01L 21/28*    (2006.01)
*H01L 21/44*    (2006.01)
*H01L 21/4763*   (2006.01)

(52) U.S. Cl. .................. 438/581; 438/630; 438/649; 438/655

(58) Field of Classification Search .................. 438/581, 438/618, 641, 649, 655, 682, 651
See application file for complete search history.

(56) References Cited

U.S. PATENT DOCUMENTS

| 4,080,719 | A   | * | 3/1978  | Wilting ...................... 438/286 |
| 5,646,070 | A   |   | 7/1997  | Chung ......................... 437/200 |
| 6,713,378 | B2  | * | 3/2004  | Drynan ....................... 438/618 |
| 6,864,178 | B1  | * | 3/2005  | Kim ........................... 438/692 |
| 6,964,901 | B2  | * | 11/2005 | Pontoh et al. ............... 438/255 |
| 7,045,408 | B2  | * | 5/2006  | Hoffmann et al. ........... 438/199 |
| 2002/0197838 | A1 | * | 12/2002 | Chittipeddi et al. ......... 438/585 |
| 2003/0011035 | A1 | * | 1/2003  | Komatsu ..................... 257/407 |
| 2004/0084746 | A1 | * | 5/2004  | Kim et al. ................... 257/503 |

FOREIGN PATENT DOCUMENTS

| JP | 10-233371  | 9/1998 |
| KR | 10-0399357 | 9/2003 |

* cited by examiner

*Primary Examiner*—Chuong A. Luu
(74) *Attorney, Agent, or Firm*—Myers Bigel Sibley & Sajovec (57) ABSTRACT

Methods of forming metal silicide layers in a semiconductor device are provided in which a first metal silicide layer may be formed on a substrate, where the first metal silicide layer comprises a plurality of fragments of a metal silicide that are separated by one or more gaps. A conductive material is selectively deposited into at least some of the gaps in the first metal silicide layer in order to electrically connect at least some of the plurality of fragments.

24 Claims, 8 Drawing Sheets

METHOD OF FORMING RELATIVELY CONTINUOUS SILICIDE LAYERS FOR SEMICONDUCTOR DEVICES

CROSS-REFERENCE TO RELATED APPLICATION

This application claims priority under 35 USC § 119 to Korean Patent Application No. 2004-80805 filed on Oct. 11, 2004, the contents of which are herein incorporated by reference in its entirety.

FIELD OF THE INVENTION

The present invention relates to methods of manufacturing semiconductor devices and, more particularly, to methods of forming metal silicide layers for semiconductor devices.

BACKGROUND OF THE INVENTION

Highly integrated semiconductor devices having rapid data transfer rates are in demand. However, certain characteristics of a semiconductor device may degrade as the semiconductor device becomes more highly integrated. For example, the width of transistor gate electrodes and impurity regions such as transistor source and drain regions are typically made smaller as the level of integration is increased. Such reductions in the line width of gate electrodes and impurity regions may degrade various characteristics of a transistor through an effect that is widely known as a short channel effect.

When a conventional polysilicon layer is formed on a contact area of a highly integrated semiconductor device, the contact resistance or sheet resistance may become very high, which can result in increased power consumption and/or decreased device operating speed. Consequently, a metal silicide layer is often formed on the gate electrode and source/drain regions to facilitate reducing the contact resistance or the sheet resistance, thereby improving the conductivity of the contact in the semiconductor device.

To form such a metal silicide layer, a metal such as, for example, titanium (Ti), nickel (Ni) or cobalt (Co), is deposited on an underlying layer that includes silicon, to form a metal layer on the underlying layer. The device is then heated, and silicon (Si) in the underlying layer reacts with metal in the metal layer to form a metal silicide layer on the underlying layer such as a titanium silicide, a nickel silicide or a cobalt silicide layer. Cobalt silicide layers are widely used because cobalt silicide may be less influenced by a critical dimension (CD) of a gate electrode of the semiconductor device having a design rule of about 200 nm.

To form a cobalt silicide layer for the semiconductor device having a design rule of about 200 nm, cobalt is deposited on a silicon substrate or a silicon pattern by, for example, a chemical vapor deposition (CVD) process to form a cobalt layer on the silicon substrate or pattern. A heat treatment is performed on the cobalt layer, and the cobalt and the silicon react with each other to form the cobalt silicide layer on the silicon substrate or the silicon pattern.

However, when the design rule for the semiconductor device is reduced below about 100 nm, it may become more difficult to provide a relatively high quality cobalt silicide layer. For example, the cobalt silicide may partially agglomerate in some areas, and may fail to form in other areas, resulting in a cobalt silicide layer that may include broken areas and/or be formed discontinuously along the gate electrode and source/drain regions due to a non-uniform distribution of the cobalt silicide. The agglomeration and discontinuities in the cobalt silicide layer may be caused by intrinsic properties of metal silicide.

Examples of methods of forming transistors including metal silicide layers are disclosed in Japanese Patent Laid-Open Publication No. 1988-233371 and U.S. Pat. No. 5,646,070.

Figure 1:
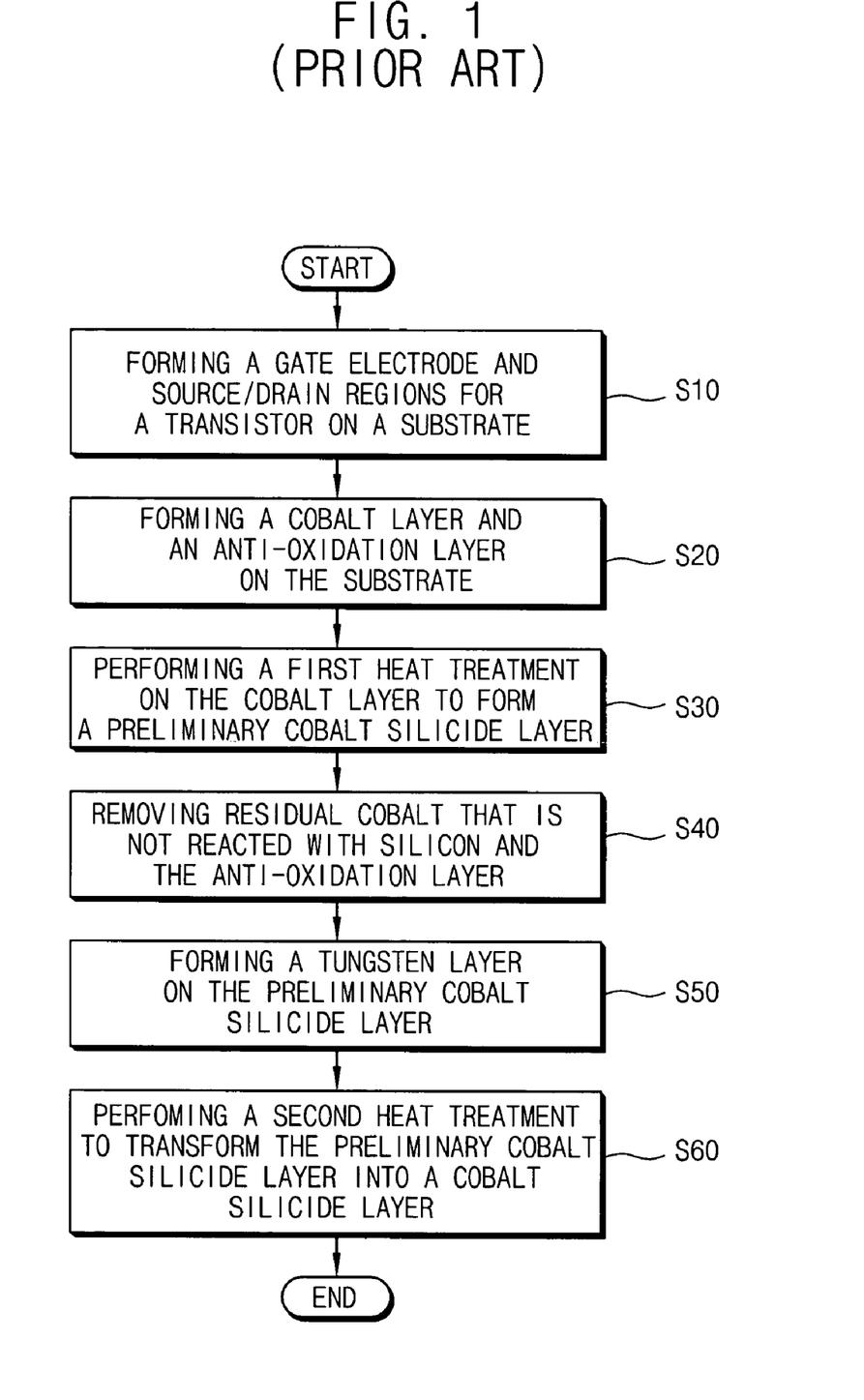
FIG. 1 is a flowchart illustrating a method of forming a conventional metal silicide layer.

FIG. 1 is a flowchart illustrating a conventional method for forming a metal silicide layer.

Referring to FIG. 1, a gate electrode and source/drain regions for a transistor are formed on a substrate (step S10). Then, a cobalt layer and an anti-oxidation layer such as a titanium nitride (TiN) layer are sequentially formed on the gate electrode and the source/drain regions (step S20). A first heat treatment is performed on the cobalt layer and the anti-oxidation layer to form a preliminary cobalt silicide (CoSi) layer on the source/drain regions and on the gate electrode by a chemical reaction of cobalt (Co) and silicon (Si) (step S30). The anti-oxidation layer and residual cobalt (Co) that did not react with the silicon (Si) are removed from the substrate, thereby exposing the preliminary cobalt silicide layer (step S40). A tungsten layer is formed on the preliminary cobalt silicide layer (step S50), and a second heat treatment is performed on the tungsten layer, thereby transforming the preliminary cobalt silicide layer into a cobalt silicide layer that has a very stable electrical resistance (step S60). Then, an insulation interlayer is formed on the resultant structure.

SUMMARY OF THE INVENTION

Pursuant to embodiments of the present invention, methods of forming metal silicide layers in a semiconductor device are provided. Pursuant to certain of these methods, a first metal silicide layer is formed on a substrate, where the first metal silicide layer comprises a plurality of fragments of a metal silicide that are separated by one or more gaps. Then the metal silicide layer is formed by selectively depositing a conductive material into at least some of the gaps in the first metal silicide layer in order to electrically connect at least some of the plurality of fragments.

In these methods, the first silicide layer may be formed by forming a metal layer on the substrate and then heating the metal layer so that metal in the metal layer and silicon (Si) in the substrate (or in a silicon pattern on the substrate) react with each other to transform at least part of the metal layer into a preliminary metal silicide layer. Then, residual metal from the metal layer that was not transformed into the preliminary metal silicide layer may be removed, and a second heat treatment is performed on the preliminary metal silicide layer to form the first metal silicide layer.

In these methods, an insulation layer may also be formed on the substrate and on the first metal silicide layer prior to selectively depositing a conductive material into at least some of the gaps in the first metal silicide layer. In such embodiments, the insulation layer may be patterned to form an insulation layer pattern through which at least portions of the first metal silicide layer are exposed. The insulation layer may be patterned, for example, using a chemical mechanical polishing process and then etching the planarized insulation layer to expose the first metal silicide layer. In certain embodiments, the insulation layer may be formed as an etch stop layer on the substrate and on the first metal silicide layer and as a first insulation layer that is on the etch stop layer. In such embodiments, the first insulation layer may be planarized by a chemical mechanical polishing process to expose the etch stop layer and the etch stop layer may be selectively etched to expose the first metal silicide layer.

The first metal silicide layer may comprise, for example, a tungsten silicide, a cobalt silicide, a nickel silicide, a nickel alloy silicide and/or a cobalt alloy silicide. The conductive material may comprise, for example, tungsten, aluminum, cobalt and/or titanium.

Pursuant to further embodiments of the present invention, methods of forming a metal silicide layer on a transistor that includes a gate electrode, a first source/drain region and a second source/drain region are provided. Pursuant to these methods, a metal layer is formed on the gate electrode, the first source/drain region and the second source/drain region. The metal layer is then transformed into a first metal silicide layer by a silicidation process in which metal in the metal layer reacts with silicon (Si) in the gate electrode and in the first and second source/drain regions. The first metal silicide layer that is formed by this process includes one or more discontinuous portions in which the gate electrode is exposed. Next, an etch stop layer is formed on the first metal silicide layer, and an insulation layer is formed on the etch stop layer. Then, an insulation layer pattern through which the etch stop layer is exposed is formed by partially removing the insulation layer. The etch stop layer may then be partially etched to form an etch stop layer pattern through which the first metal silicide layer is exposed along the gate electrode. Finally, a second metal silicide layer is formed by selectively depositing a conductive material onto the portions of the gate electrode exposed through the one or more discontinuous portions of the first metal silicide layer.

The metal layer may be transformed into the first metal silicide layer by, for example, forming an anti-oxidation layer on the metal layer and then heating the metal layer, so that metal in the metal layer and the silicon (Si) in the gate electrode and in the first and second source/drain regions react with each other to form a preliminary metal silicide layer on the gate electrode and on the first and second source/drain regions. Residual metal from the metal layer that did not react with the silicon in the gate electrode and the first and second source/drain regions may then be removed along with the anti-oxidation layer. Then the preliminary metal silicide layer may be heated so as to form the first metal silicide layer that includes one or more discontinuous portions in which the gate electrode is exposed. The metal layer may be heated, for example, at a temperature of about 400° C. to about 600° C., and the preliminary metal silicide layer may be heated, for example, at a temperature of about 800° C. to about 1000° C.

Pursuant to still further embodiments of the present invention, methods of forming a transistor are provided in which a gate electrode and source/drain regions are formed on a silicon layer. A first metal silicide layer is formed on the gate electrode. The first metal silicide layer may include one or more discontinuous portions. Then, a supplemental metal is deposited into at least some of the discontinuous portions of the first metal silicide layer. The silicon layer may comprise, for example, a silicon substrate.

In these methods, the first metal silicide layer may be formed by forming a metal layer on the gate electrode, and then heating the metal layer at a temperature between about 440° C. and about 600° C. to form a preliminary metal silicide layer. The preliminary metal silicide layer is then heated at a temperature between about 750° C. and about 950° C. to form the first metal silicide layer. An anti-oxidation layer may be formed on the metal layer prior to heating the metal layer. Metal from the metal layer that was not transformed into the preliminary metal silicide layer may be removed prior to the second heat treatment, as may the anti-oxidation layer.

Before depositing the supplemental metal into at least some of the discontinuous portions of the first metal silicide layer, an etch stop layer may be formed on the first metal silicide layer, and an insulation layer may be formed on the etch stop layer. The insulation layer may then be planarized to expose the etch stop layer, and a portion of the etch stop layer that is on the first metal silicide layer may be removed.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising" and "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the exact shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Pursuant to embodiments of the present invention, methods of forming metal silicide layers for semiconductor devices having a design rule below about 80 nm and, particularly below about 60 nm, are provided. However, other embodiments of the invention may be used with higher design rules. In certain embodiments of these methods, a metal layer and an anti-oxidation layer are sequentially formed on a substrate that includes a silicon pattern. Examples of the metal layer may include tungsten (W), aluminum (Al), nickel (Ni), cobalt (Co), titanium (Ti), nickel alloy, cobalt alloy, etc. The metal layer may be formed, for example, by a chemical vapor deposition (CVD) process or an atomic layer deposition (ALD) process. A silicidation process may then be performed that includes first and second heat treatments. During the first heat treatment, metal in the metal layer and silicon (Si) in the silicon pattern react with each other to form a preliminary metal silicide layer that has a metal-Si structure on the substrate. Then, residual metal (i.e., metal that did not react with silicon) and the anti-oxidation layer are removed. The second heat treatment is performed on the preliminary metal silicide layer to form a first metal silicide layer that has a metal-Si2 structure.

The first heat treatment may be carried out, for example, at a temperature in a range from about 440° C. to about 600° C., and the second heat treatment may be carried out, for example, at a temperature in a range from about 750° C. to about 950° C. In one embodiment of the present invention, the first heat treatment is carried out at a temperature of about 450° C. to about 520° C., and the second heat treatment is carried out at a temperature of about 850° C.

Figure 2:
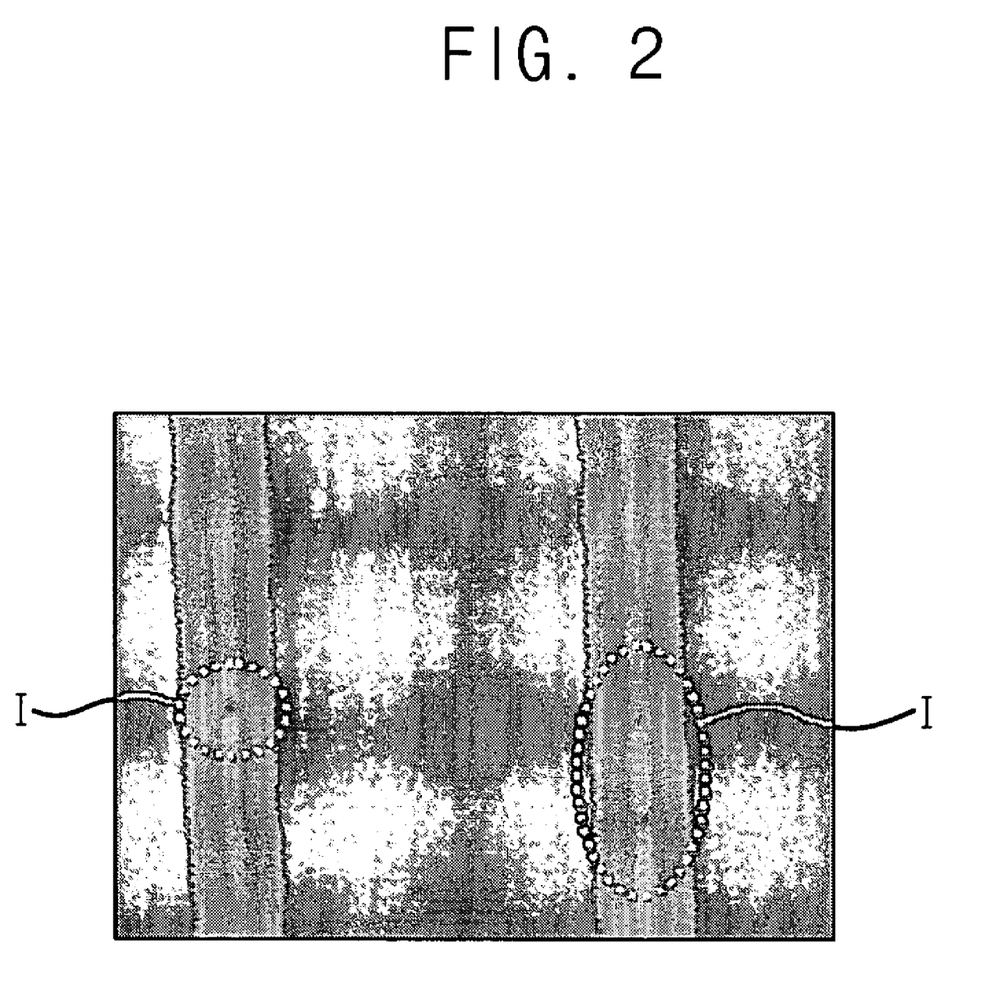
FIG. 2 is a scanning electron microscope image illustrating a first metal silicide layer.

FIG. 2 is an image of a first metal silicide layer. As shown in FIG. 2, the first metal silicide layer has a plurality of discontinuous portions I. These discontinuous portions I may form, for example, due to agglomeration of the metal during the heat treatments.

Next, an insulation layer is formed on the substrate including the first metal silicide layer that may include the discontinuous portions I. The insulation layer may comprise, for example, plasma enhanced tetraethyl orthosilicate (PE-TEOS), undoped silicate glass (USG), spin on glass (SOG), flowable oxide (FOX), etc. The insulation layer may then be planarized by, for example, a chemical mechanical polishing (CMP) process and may be partially etched to form an insulation layer pattern through which the first metal silicide layer is exposed.

In certain embodiments of the present invention, an etch stop layer may be formed on the first metal silicide layer prior to formation of the insulation layer. The etch stop layer may be formed conformally on the first metal silicide layer, and the insulation layer may be formed on the etch stop layer to sufficiently cover the resultant structure. The insulation layer may then be planarized using, for example, a CMP process until a surface of the etch stop layer is exposed to form an insulation layer pattern. The etch stop layer may then be partially etched to form an etch stop layer pattern. The first metal silicide layer (which may include the discontinuous portions I) is exposed through the etch stop layer pattern and the insulation layer pattern.

The etch stop layer may reduce and/or prevent the first metal silicide layer from being damaged during the CMP process. Examples of the etch stop layer may include nitride, silicon nitride, silicon oxynitride, etc. These can be used alone or in combinations thereof.

Next, a supplemental metal is selectively deposited onto the discontinuous portions I of the first metal silicide layer. The supplemental metal may be used to transform the first metal silicide layer into a continuous second metal silicide layer. Examples of the supplemental metal may include tungsten (W), aluminum (Al), cobalt (Co), titanium (Ti), etc. These can be used alone or in combinations thereof. The supplemental metal may be deposited, for example, using a selective chemical vapor deposition process.

In certain embodiments of the present invention, the supplemental metal may be deposited only onto the discontinuous portions of the first metal silicide layer and not onto the insulation layer. The supplemental metal may be deposited onto sidewalls of the discontinuous portions of the first metal silicide layer and deposited onto an underlying surface that is exposed through the discontinuous portions of the first metal silicide layer. In this manner, some or all of the discontinuous portions of the first metal silicide layer may be partially or completely filled with the supplemental metal. Thus, the discontinuous portions of the first metal silicide layer may be filled with the supplemental metal by a selective CVD process without the need for an additional heat treatment. As a result, deterioration of operational characteristics of the transistor caused by the additional heat treatment may be sufficiently minimized, and further, a bridge failure between adjacent metal wires may also be reduced and/or minimized because a gate electrode of a transistor of the present invention may be formed to be thinner than the gate electrode of a conventional transistor.

Hereinafter, example embodiments of the present invention will be described in detail with reference to the accompanying drawings.

Embodiment 1

FIGS. 3 to 6 are perspective views illustrating processing steps for a method of forming a metal silicide layer in accordance with a first example embodiment of the present invention.

Figure 3:
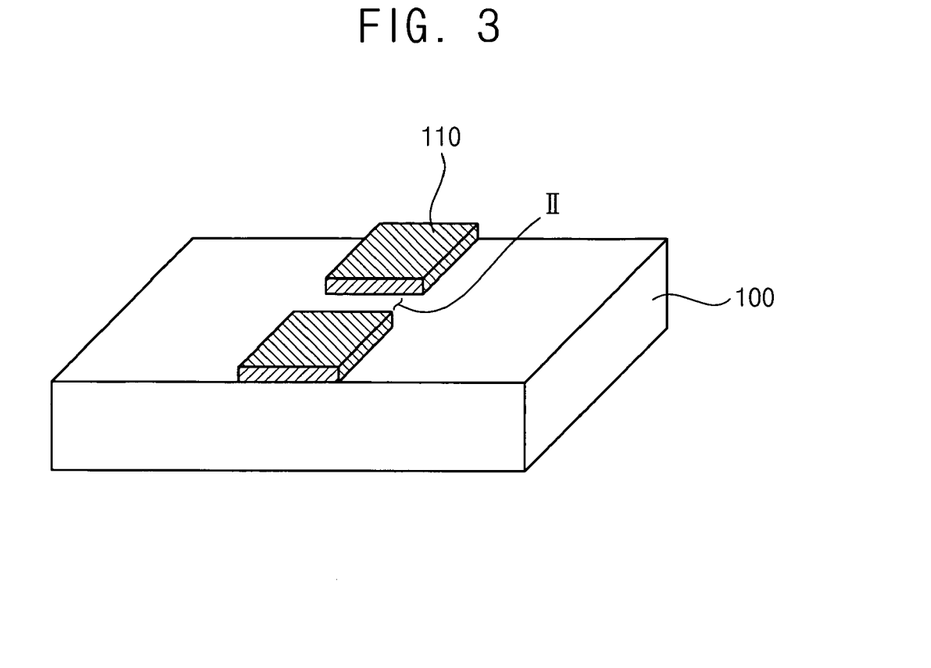
FIGS. 3 to 6 are perspective views illustrating processing steps for methods of forming a metal silicide layer in accordance with embodiments of the present invention.

As shown in FIG. 3, a first metal silicide layer 110 is formed along an active region of a semiconductor substrate 100 on which various conductive structures such as a gate electrode and source/drain regions are formed. The electrical resistance of the first metal silicide layer 110 is relatively low as compared with a conventional polysilicon layer. The first metal silicide layer 110 may include a discontinuous portion II caused by, for example, agglomeration of metal during a heat treatment on the substrate 100.

The first metal silicide layer 110 may be formed as follows. A silicidation blocking layer (not shown) is formed on the substrate 100 and is patterned into a silicidation blocking layer pattern through which a portion of the substrate 100 is exposed. The first metal silicide layer 110 is formed on the exposed substrate 100 in a subsequent process. Hereinafter, portions of the substrate 100 exposed through the silicidation blocking layer pattern are referred to as a silicidation active region and the other portions of the substrate 100 that are covered by the silicidation blocking layer pattern are referred to as a silicidation inactive region. The first metal silicide layer 110 is formed in the silicidation active region of the substrate 100.

A metal is deposited onto a whole surface of the substrate 100 including the silicidation blocking layer pattern to form a metal layer (not shown) on the surface of the silicidation active region of the substrate 100 and on the silicidation blocking layer pattern corresponding to the silicidation inactive region. Examples of the metal may include cobalt (Co), titanium (Ti), tungsten (W), nickel (Ni), etc. These metals can be used alone or in combination. In the present embodiment, a cobalt layer is formed on the substrate 100 by a CVD process.

A first rapid heat treatment is performed on the substrate 100 including the metal layer at a temperature of about 550° C. to about 650° C., so that metal in the metal layer and silicon (Si) in the substrate 100 react with each other to form a preliminary metal silicide layer on the substrate 100. In the present embodiment, a preliminary cobalt silicide (CoSi) layer is formed on the substrate 100. Then, a second rapid heat treatment is performed on the substrate 100 including the preliminary metal silicide layer at a temperature of about 850° C. to about 950° C., so that the preliminary metal silicide layer is transformed into a first metal silicide layer 110. In the present embodiment, the preliminary cobalt silicide (CoSi) layer is transformed into a cobalt silicide (CoSi$_2$) layer as the first metal silicide layer 110.

However, the first metal silicide layer 110 may still include the discontinuous portion(s) II (see FIG. 3) caused by agglomeration of metal during the second heat treatment. The discontinuous portion(s) II corresponds to the discontinuous portion(s) I in the scanning electron microscope (SEM) image of FIG. 2.

Figure 4:
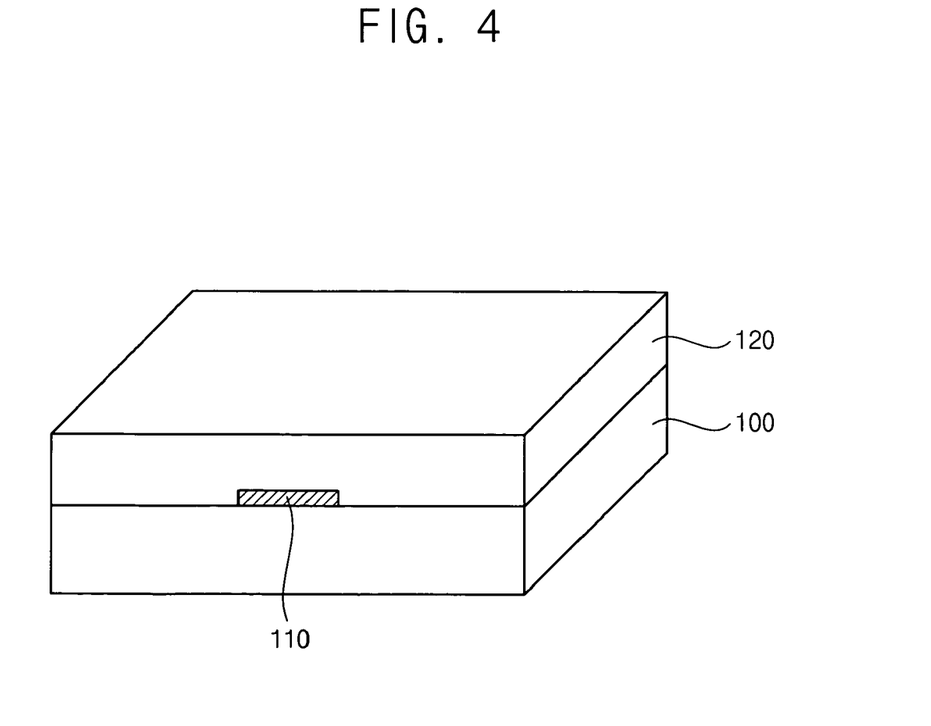

Referring to FIG. 4, an insulation layer 120 is formed on the substrate 100 to cover the first metal silicide layer 110.

The insulation layer 120 may comprise, for example, plasma enhanced tetra ethyl ortho silicate (PE-TEOS), flowable oxide (FOX), spin on glass (SOG), undoped silicate glass (USG), etc. The insulation layer 120 in this embodiment includes PE-TEOS.

Figure 5:
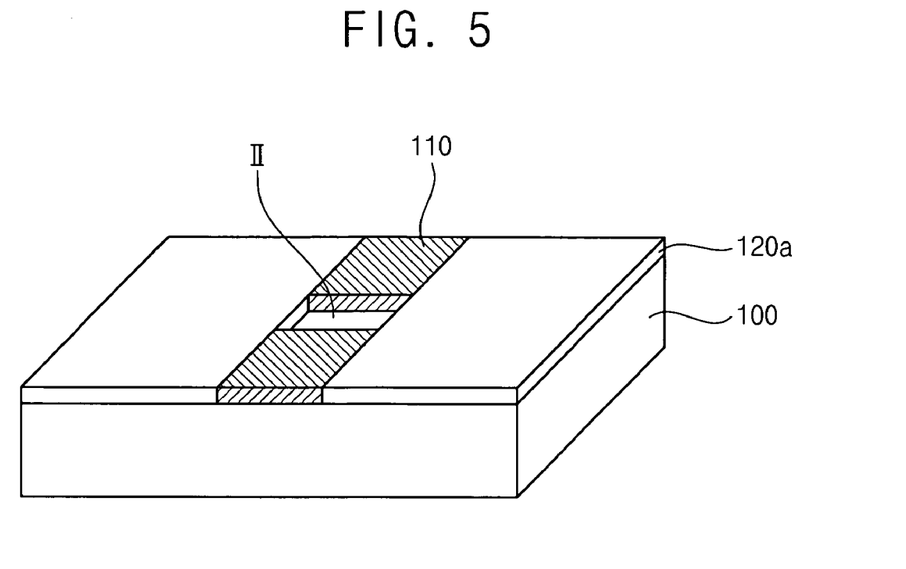

As shown in FIG. 5, the insulation layer 120 is removed and planarized until a surface of the first metal silicide layer 110 is exposed. This planarization may be performed, for example, using a chemical mechanical polishing (CMP) process. As a result of the planarization process, an insulation layer pattern 120a is formed through which the first metal silicide layer 110 including the discontinuous portions II is exposed. An etch stop layer (not shown) may optionally be formed on the first metal silicide layer 110 prior to the CMP process to reduce and/or minimize damage to the first metal silicide layer 110 during the CMP process. Then, an etching process is performed against the insulation layer 120 remaining in the discontinuous portion II, so that the substrate 100 is partially exposed through the discontinuous portion II of the first metal silicide layer 110.

Figure 6:
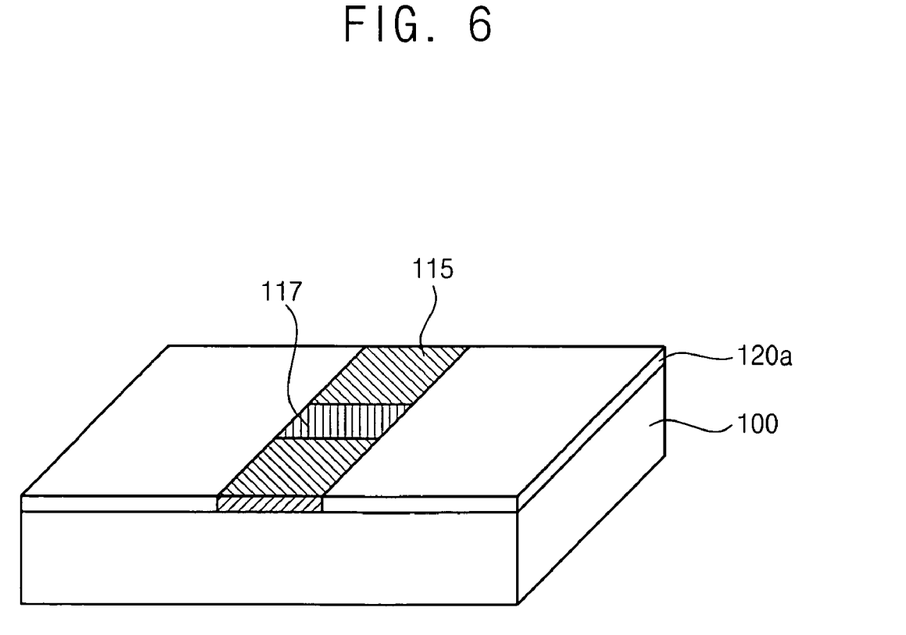

As shown in FIG. 6, a supplemental metal 117 is selectively deposited (e.g., via a selective chemical vapor deposition process) into the discontinuous portion II of the first metal silicide layer 110 to form a continuous second metal silicide layer 115 in which fragments of the discontinuous first metal silicide layer 110 are connected to each other by the supplemental metal 117. The second metal silicide layer 115 may include a reduced number of the discontinuous portions II and/or may be a continuous layer. In the present embodiment, the second metal silicide layer 115 comprises a cobalt silicide.

During the selective CVD process, the supplemental metal 117 may be deposited only into the discontinuous portion II of the first metal silicide layer 110. The supplemental metal 117 may be deposited onto the sidewalls of the discontinuous portions II of the first metal silicide layer 110 and deposited onto the surface of the substrate 100 that is exposed through the discontinuous portions II of the first metal silicide layer 110. Using the selective CVD process, the discontinuous portions II of the first metal silicide layer 110 may be partially or completely filled with the supplemental metal 117 to form the second metal silicide layer 115 that has reduced numbers of discontinuous portions (or to form a continuous metal silicide layer 115).

Embodiment 2

FIGS. 7 to 12 are perspective diagrams illustrating processing steps for a method of forming a silicide layer for a semiconductor device in accordance with another example embodiment of the present invention.

Figure 7:
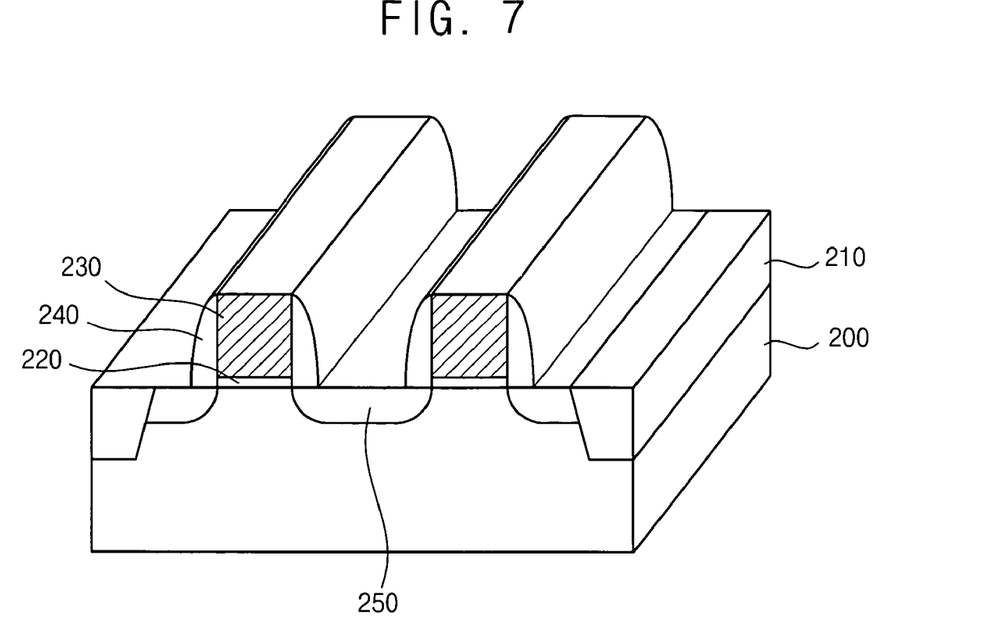
FIGS. 7 to 13 are perspective views illustrating processing steps for methods of forming a silicide layer for a semiconductor device in accordance with example embodiments of the present invention.

As shown in FIG. 7, a field oxide layer 210 is formed on a silicon substrate 200 to define an active region and a field region on the substrate 200. The field oxide layer 210 may be formed, for example, using a shallow trench isolation (STI) process. A gate oxide layer 220 is formed on the substrate 200, and then a polysilicon layer is formed on the gate oxide layer 220. In an example embodiment of the present invention, the polysilicon layer may be heavily doped with N-type impurities. A photoresist film may then be coated on the polysilicon layer, and the photoresist film may be patterned using a photolithography process to form a photoresist pattern that partially exposes the polysilicon layer.

The exposed polysilicon layer may then be etched using the photoresist pattern as an etching mask to expose a surface of the substrate 200. Thereafter, the photoresist pattern may be removed from the substrate 200 to form a gate electrode 230.

Ions may be implanted through surface portions of the substrate 200 by an ion implantation process (IIP) using the gate electrode 230 as an ion implantation mask to form source/drain regions 250 around the gate electrode 230. Other methods of forming source/drain regions that are known to those of skill in the art may also be used.

An insulation layer is formed on the substrate 200. The insulation layer may have a sufficient thickness to cover the gate electrode 230. The insulation layer may then be anisotropically etched until a surface of the substrate 200 is exposed to form a gate spacer 240 on one or more sidewalls of the gate electrode 230. The insulation layer may comprise, for example, silicon nitride.

Figure 8:
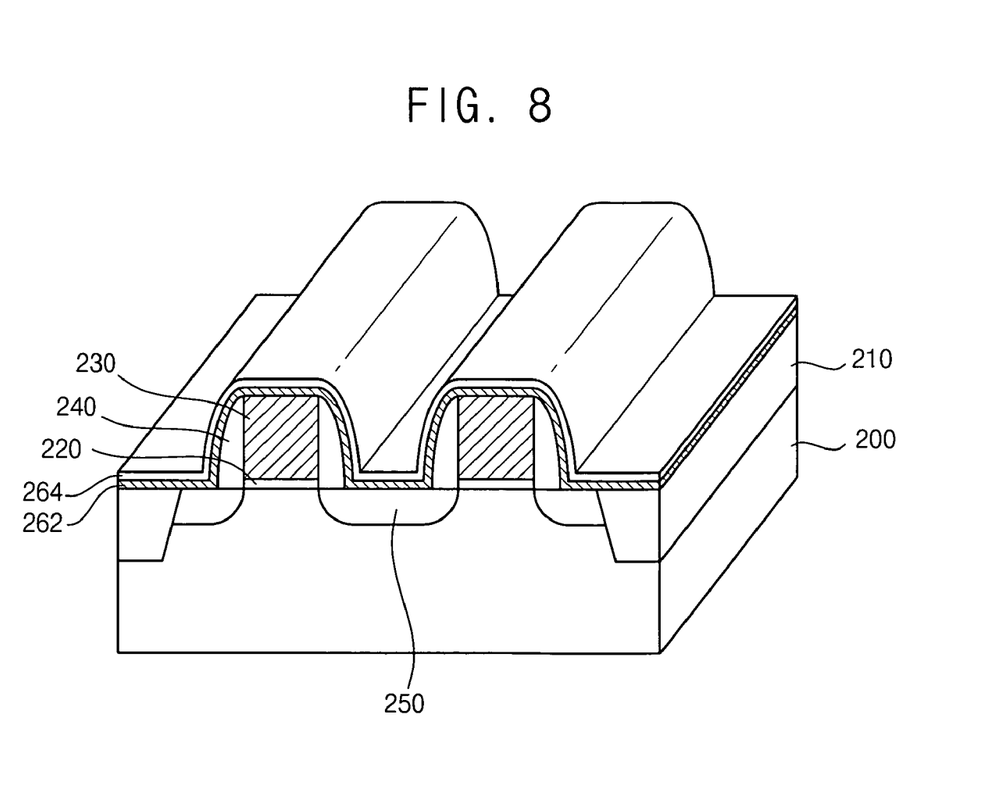

As shown in FIG. 8, a metal layer 262 and an anti-oxidation layer 264 may be sequentially formed on the substrate 200, the gate electrode 230 and the source/drain regions 250. The metal layer 262 may comprise, for example, cobalt (Co), titanium (Ti), tungsten (W), nickel (Ni), etc. A single metal or a combination of metals may be used. In the present embodiment, the metal layer 262 includes cobalt (Co). The anti-oxidation layer 264 may reduce and/or prevent a surface of the metal layer 262 from oxidation during a subsequent silicidation process through which the metal is transformed into a metal silicide layer on the gate electrode 230 and the source/drain regions 250.

Figure 9:
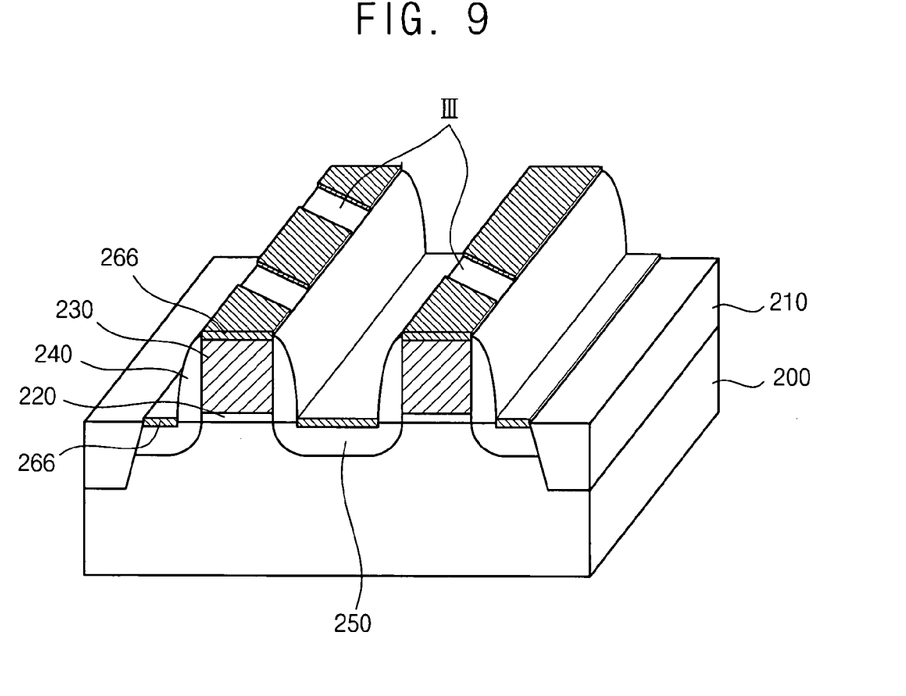

As shown in FIG. 9, a first metal silicide layer 266 including discontinuous portions III that may result from, for example, agglomeration of metal, is formed on the gate electrode 230 and the source/drain regions 250.

Next, a first heat treatment is carried out on the substrate 200 including the metal layer 262 at a temperature of, for example, about 550° C. The heat treatment may comprise a rapid heat treatment. During the first heat treatment, metal in the metal layer 262 and silicon (Si) in the substrate 200 may react with each other to form a preliminary metal silicide layer having a metal-Si structure on the substrate 200, the gate electrode 230 and/or the source/drain regions 250. When, for example, the metal layer includes cobalt (Co), the preliminary metal silicide layer may comprise a cobalt silicide (CoSi) that is formed on the gate electrode 230 and the source/drain regions 250. The preliminary cobalt silicide layer may not form on the field region 210 and/or the gate spacer 240 because there may be insufficient silicon (Si) to react with the cobalt (Co).

A second heat treatment may then be carried out on the preliminary metal silicide layer at a temperature of, for example, about 850° C. The second heat treatment may comprise a rapid heat treatment. During the second heat treatment, the preliminary metal silicide layer having the metal-Si structure may be transformed into a metal silicide layer having a metal-Si$_2$ structure, which is referred to herein as the first metal silicide layer 266. The first metal silicide layer 266 may have a stable electric resistance. Thus, in the present embodiment discussed above in which the preliminary metal silicide layer comprises a cobalt silicide (CoSi$_2$), the cobalt silicide (CoSi$_2$) is transformed into a cobalt silicide (CoSi$_2$) layer which comprises the first metal silicide layer 266. Ions implanted at surface portions of the source/drain regions 250 may also be activated during the first and second heat treatments of the above-described silicidation process.

When the above-mentioned process for forming the first metal silicide layer 266 is used to manufacture semiconductor devices having a design rule of below about 100 nm, the first metal silicide layer 266 may include discontinuous portions III (see FIG. 9) caused by, for example, an agglomeration of metal. When this occurs, residual metal that did not react with the silicon (Si) may be removed, as may the anti-oxidation layer 264, using, for example, an etching process.

Figure 10:
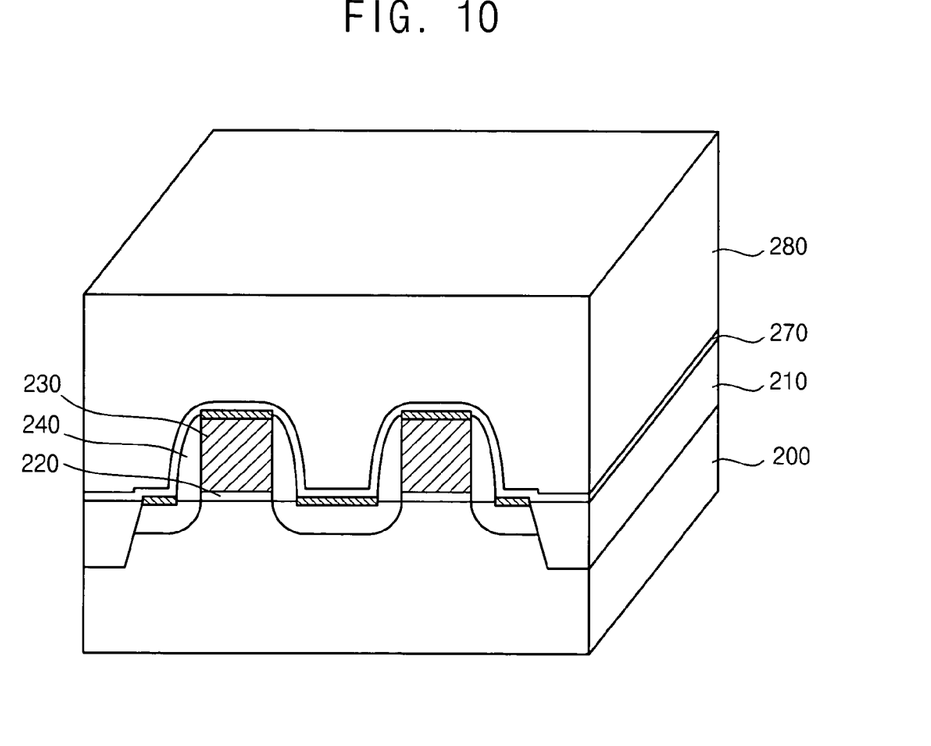

As shown in FIG. 10, an etch stop layer 270 and an insulation layer 280 may next be sequentially formed on the substrate 200, the first metal silicide layer 266 (which may include the discontinuous portions II) and the source/drain regions 250. The insulation layer 280 may comprise, for example, PE-TEOS, FOX, SOG, USG, etc.

Figure 11:
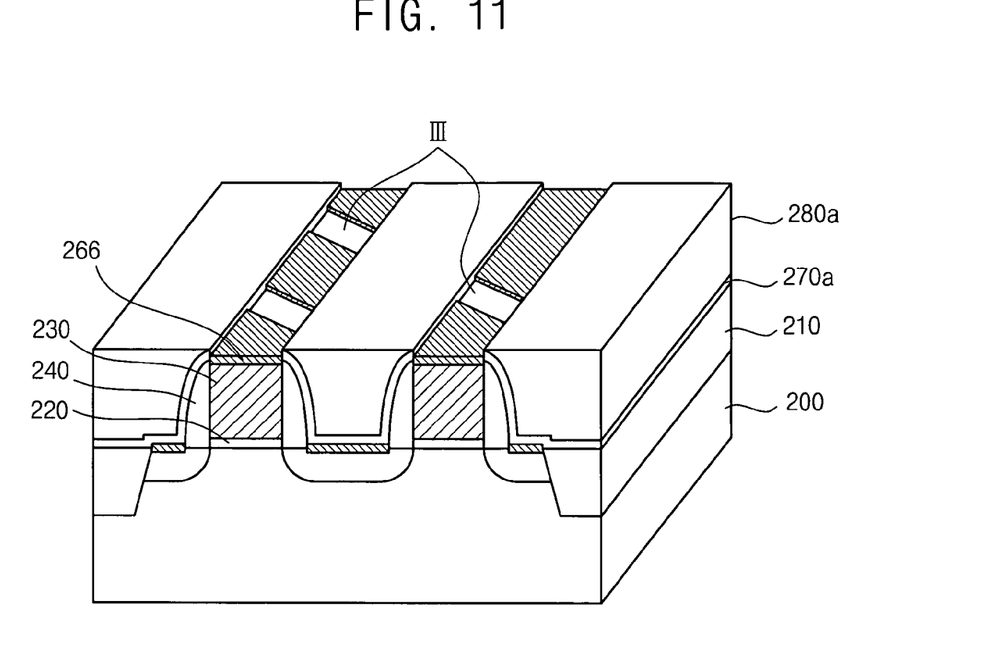

Referring to FIG. 11, a CMP process may then be performed on the insulation layer 280 to expose a surface of the etch stop layer 270. This CMP process may thus form an insulation layer pattern 280a. Then, the exposed portions of the etch stop layer 270 may be etched away to form an etch stop layer pattern 270a that exposes the first metal silicide layer 266 having the discontinuous portions III.

Figure 12:
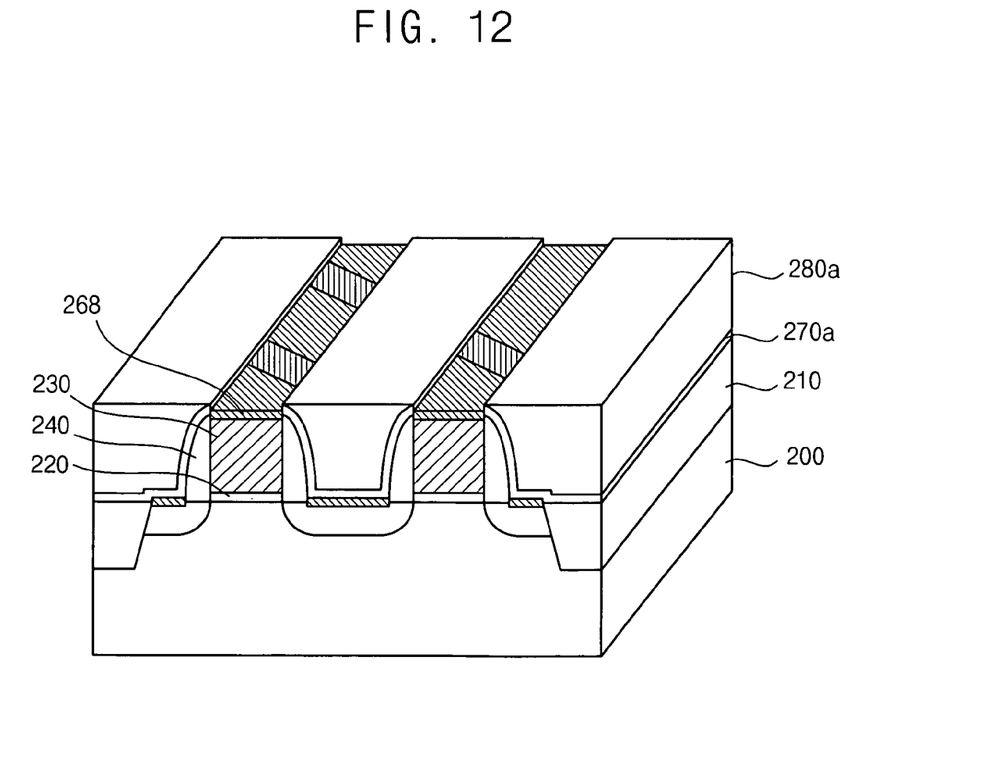

As shown in FIG. 12, a supplemental metal may then be selectively deposited onto the discontinuous portions III of the first metal silicide layer 266 by, for example, a selective CVD process. By this process, the discontinuous portions II of the first metal silicide layer 266 may be partially or completely filled with the supplemental metal. As a result, a second silicide layer 268 is formed in which fragments of the first metal silicide layer 266 may be connected to each other by the supplemental metal. The second silicide layer 268 is more continuous than the first metal silicide layer 266, and may be a completely continuous layer in some embodiments of the present invention. The supplemental metal may comprise, for example, tungsten (W).

In certain embodiments of the present invention, during the selective CVD process the supplemental metal is not deposited onto the insulation layer pattern 280a, and instead is only deposited onto the discontinuous portions III of the first metal silicide layer 266. In such embodiments, the supplemental metal may be deposited onto sidewalls of the discontinuous portions III of the first metal silicide layer 266 and onto surfaces of gate electrode 230 that are exposed through the discontinuous portions III of the first metal silicide layer 266.

Figure 13:
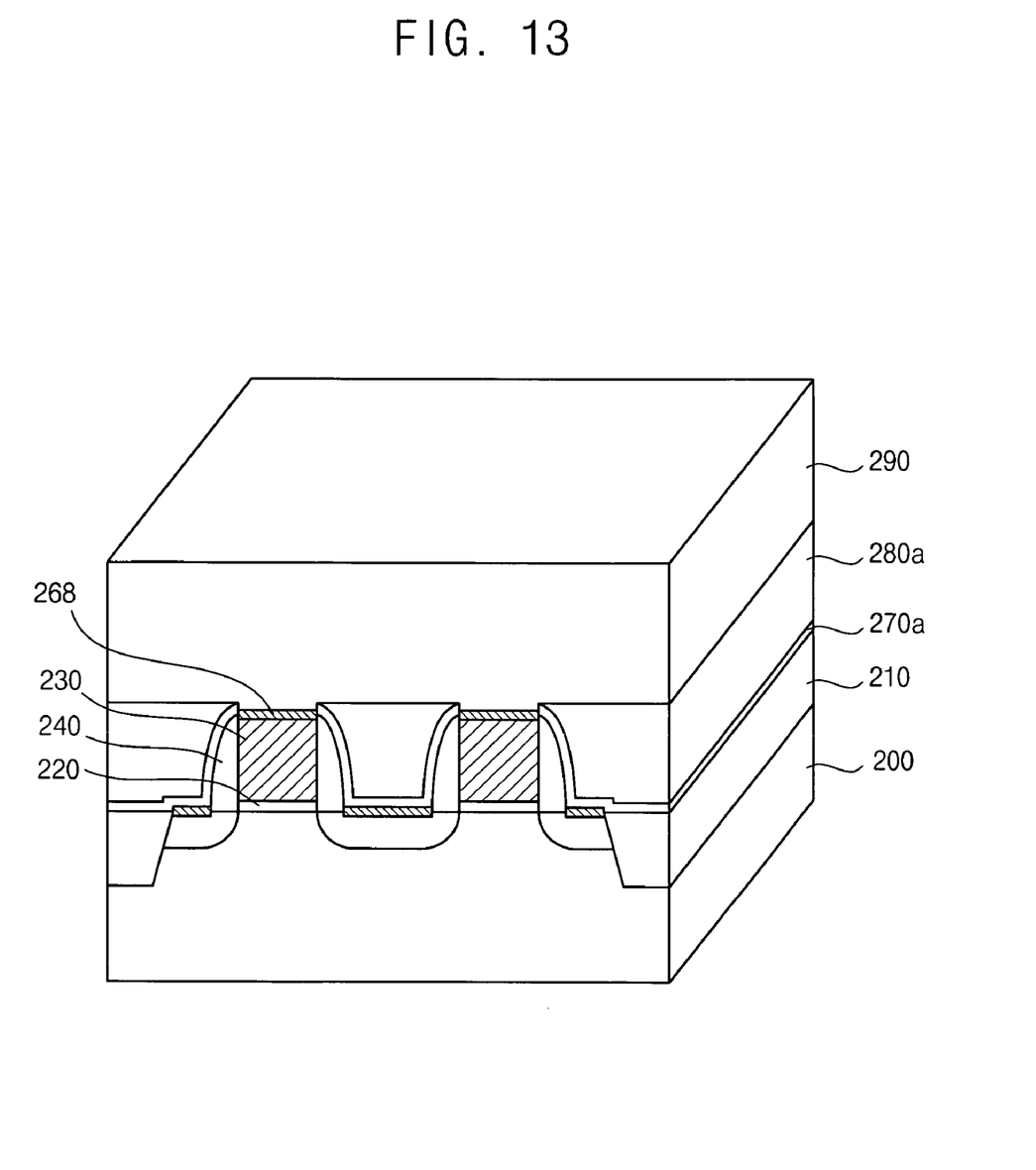

As shown in FIG. 13, an insulation interlayer 290 may be formed on a resultant structure formed on the substrate 200. Portions of the insulation interlayer 290 may then be removed to form a contact hole (not shown) through which, for example, the metal silicide layer 268 on the source/drain regions 250 are exposed. A conductive material is deposited into the contact hole to form a contact plug (not shown) that makes electrical contact with the metal silicide layer 268.

According to example embodiments of the present invention, an insulation layer is formed on a metal silicide layer that has discontinuous portions therein, and is partially etched away to form an insulation layer pattern through which a surface of the metal silicide layer is exposed. Then, a supplemental metal is selectively deposited into the discontinuous portions of the metal silicide layer, so that fragments of the metal silicide layer are connected to each other by the supplemental metal to form a more continuous metal silicide layer. In this manner, discontinuous portions of the metal silicide layer may be connected without an additional heat treatment.

In embodiments of the present invention, the discontinuous portions of the first metal silicide layer may be removed without increasing the thickness of the gate electrode. This may reduce the possibility of bridge failure between adjacent metal wirings.

In addition, in embodiments of the present invention, discontinuous portions in the metal silicide layer may be filled without use of a photomask, so that the metal silicide layer may be formed on gate electrode with very small design rules, such as design rules of less than about 80 nm.

The foregoing is illustrative of the present invention and is not to be construed as limiting thereof. Although a few example embodiments of this invention have been described, those skilled in the art will readily appreciate that many modifications are possible in the example embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method for forming a metal silicide layer of a semiconductor device, the method comprising:
    forming a gate electrode extending in a direction on a substrate;
    forming a first metal silicide layer on the gate electrode, wherein the first metal silicide layer comprises a plurality of fragments of a metal silicide that are separated by one or more gaps and wherein the gate electrode is partially exposed through the one or more gaps in the first metal silicide layer; and
    depositing a conductive material onto portions of the gate electrode that are exposed through the one or more gaps in the first metal silicide layer in order to form a second metal silicide layer in at least some of the gaps.

2. A method for forming a metal silicide layer of a semiconductor device, the method comprising:
    forming a gate electrode extending in a direction on a substrate;
    forming a first metal silicide layer on the gate electrode, wherein the first metal silicide layer comprises a plurality of fragments of a metal silicide that are separated by one or more gaps and wherein the gate electrode is partially exposed through the one or more gaps in the first metal silicide layer;
    forming an insulation layer pattern on the first metal silicide layer, wherein the first metal silicide layer is exposed along the gate electrode through the insulation layer pattern; and
    selectively depositing a conductive material onto portions of the gate electrode that are exposed through the one or more gaps in the first metal silicide layer in order to electrically connect at least some of the plurality of fragments to form a second metal silicide layer,
    wherein forming the first metal silicide layer comprises:
    forming a metal layer on the electrode; and
    heating the metal layer so that a metal in the metal layer and silicon (Si) in the gate electrode on the substrate react with each other to transform at least part of the metal layer into a preliminary metal silicide layer.

3. The method of claim 2, wherein forming the first metal silicide layer further comprises:
    removing a residual portion of the metal in the metal layer that was not transformed into the preliminary metal silicide layer; and
    performing a heat treatment on the preliminary metal silicide layer to form the first metal silicide layer.

4. A method for forming a metal silicide layer of a semiconductor device, the method comprising:
    forming a gate electrode extending in a direction on a substrate;
    forming a first metal silicide layer on the gate electrode, wherein the first metal silicide layer comprises a plurality of fragments of a metal silicide that are separated by one or more gaps and wherein the gate electrode is exposed through the one or more gaps in the first metal silicide layer;
    selectively depositing a conductive material onto portions of the gate electrode that are exposed through the one or more gaps in the first metal silicide layer in order to electrically connect at least some of the plurality of fragments to form a second metal silicide layer;
    forming an insulation layer on the first metal silicide layer prior to selectively depositing a conductive material into at least some of the gaps in the first metal silicide layer; and
    patterning the insulation layer to form an insulation layer pattern through which at least portions of the first metal silicide layer are exposed along the gate electrode.

5. The method of claim 4, wherein patterning the insulation layer comprises:
    planarizing the insulation layer by a chemical mechanical polishing process; and
    etching the planarized insulation layer to expose the first metal silicide layer.

6. The method of claim 4, wherein forming the insulation layer comprises:
    forming an etch stop layer on the substrate and on the first metal silicide layer; and
    forming the insulation layer on the etch stop layer;
    and wherein patterning the insulation layer to form the insulation layer pattern comprises:
    planarizing the insulation layer by a chemical mechanical polishing process to expose the etch stop layer; and
    selectively etching the etch stop layer to expose the first metal silicide layer.

7. The method of claim 1, wherein the first metal silicide layer comprises a tungsten silicide, a cobalt silicide, a nickel silicide, a nickel alloy silicide and/or a cobalt alloy silicide.

8. The method of claim 1, wherein the conductive material comprises tungsten, aluminum, cobalt and/or titanium.

9. The method of claim 1, the method further comprising:
    forming an insulation layer on the substrate and on the first metal silicide layer prior to selectively depositing a conductive material into at least some of the gaps in the first metal silicide layer; and
    patterning the insulation layer to form an insulation layer pattern through which at least portions of the first metal silicide layer are exposed along the gate electrode, and
    wherein forming the first metal silicide layer comprises:
    forming a metal layer on the gate electrode; and
    heating the metal layer so that a metal in the metal layer and silicon (Si) in the gate electrode on the substrate react with each other to transform at least part of the metal layer into a preliminary metal silicide layer.

10. The method of claim 9, wherein patterning the insulation layer comprises:
    planarizing the insulation layer by a chemical mechanical polishing process; and
    etching the planarized insulation layer to expose the first metal silicide layer.

11. The method of claim 10, wherein forming the insulation layer comprises:
    forming an etch stop layer on the substrate and on the first metal silicide layer; and
    forming the insulation layer on the etch stop layer;
    and wherein patterning the insulation layer to form the insulation layer pattern comprises:

planarizing the insulation layer by a chemical mechanical polishing process to expose the etch stop layer; and selectively etching the etch stop layer to expose the first metal silicide layer.

12. The method of claim 11, wherein forming the first metal silicide layer further comprises:

removing a residual portion of the metal in the metal layer that was not transformed into the preliminary metal silicide layer; and performing a heat treatment on the preliminary metal silicide layer to form the first metal silicide layer.

13. The method of claim 9, wherein forming the first metal silicide layer further comprises:

removing a residual portion of the metal in the metal layer that was not transformed into the preliminary metal silicide layer; and performing a heat treatment on the preliminary metal silicide layer to form the first metal silicide layer.

14. The method of claim 13, wherein the first metal silicide layer comprises a cobalt silicide, a nickel silicide, a nickel alloy silicide and/or a cobalt alloy silicide, and wherein the conductive material comprises aluminum and/or cobalt.

15. The method of claim 4, wherein the first metal silicide layer comprises a tungsten silicide, a cobalt silicide, a nickel silicide, a nickel alloy silicide and/or a cobalt alloy silicide, and wherein the conductive material comprises tungsten, aluminum, cobalt and/or titanium.

16. The method of claim 2, wherein the first metal silicide layer comprises a tungsten silicide, a cobalt silicide, a nickel silicide, a nickel alloy silicide and/or a cobalt alloy silicide, and wherein the conductive material comprises tungsten, aluminum, cobalt and/or titanium.

17. The method of claim 1, further comprising depositing a silicidation blocking layer on the substrate and patterning the silicidation blocking layer prior to forming the first metal silicide layer.

18. The method of claim 1, wherein forming a first metal silicide layer on the gate electrode, wherein the first metal silicide layer comprises a plurality of fragments of a metal silicide that are separated by one or more gaps comprises:

forming a metal layer and an anti-oxidation layer on the substrate; and heating the metal layer so that a metal in the metal layer and silicon (Si) in the gate electrode on the substrate react with each other to transform at least part of the metal layer into a preliminary metal silicide layer;

removing at least part of the anti-oxidation layer and a residual portion of the metal in the metal layer that was not transformed into the preliminary metal silicide layer; and performing a heat treatment on the preliminary metal silicide layer to form the first metal silicide layer.

19. The method of claim 1, wherein the conductive material is only deposited into gaps in the first metal silicide layer.

20. The method of claim 4, further comprising depositing a silicidation blocking layer on the substrate and patterning the silicidation blocking layer prior to forming the first metal silicide layer.

21. The method of claim 1, further comprising forming a silicon pattern on the substrate prior to forming the first metal silicide layer, wherein forming the first metal silicide layer on the substrate comprises forming the first metal silicide layer on the silicon pattern that is on the substrate.

22. The method of claim 2, wherein the metal layer is deposited over the whole surface of the substrate.

23. The method of claim 2, wherein the conductive material comprises a metal that is different than the metal used to form the first metal silicide layer.

24. The method of claim 2, wherein selectively depositing the conductive material onto portions of the gate electrode that are exposed through the one or more gaps in the first metal silicide layer comprises depositing the conductive material only into the gaps in the first metal silicide layer.

* * * * *